US006590228B2

United States Patent
Voutsas et al.

(10) Patent No.: US 6,590,228 B2
(45) Date of Patent: *Jul. 8, 2003

(54) LCD DEVICE WITH OPTIMIZED CHANNEL CHARACTERISTICS

(75) Inventors: Apostolos Voutsas, Vancouver, WA (US); John W. Hartzell, Camas, WA (US); Yukihiko Nakata, Nara (JP)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/256,360

(22) Filed: Sep. 26, 2002

(65) Prior Publication Data

US 2003/0025119 A1 Feb. 6, 2003

Related U.S. Application Data

(62) Division of application No. 09/774,296, filed on Jan. 29, 2001, now Pat. No. 6,495,405.

(51) Int. Cl.[7] .................. H01L 27/108; H01L 29/04; H01L 29/76; H01L 31/036; H01L 31/112
(52) U.S. Cl. ....................... 257/70; 257/72; 257/75; 257/627
(58) Field of Search .................. 257/49, 64–66, 257/70–72, 74, 75, 627; 438/149, 150, 166, 479, 481, 482, 486, 487, 488, 507, 509

(56) References Cited

U.S. PATENT DOCUMENTS 5,821,562 A * 10/1998 Makita et al. ............... 257/64
6,177,301 B1 * 1/2001 Jung ........................... 438/150

* cited by examiner

Primary Examiner—Kamand Cuneo
Assistant Examiner—Asok Kumar Sarkar
(74) Attorney, Agent, or Firm—Matthew D. Rabdau; David C. Ripma; Scott C. Krieger

(57) ABSTRACT

A method is provided to optimize the channel characteristics of thin film transistors (TFTs) on polysilicon films. The method is well suited to the production of TFTs for use as drivers on liquid crystal display devices. Regions of polycrystalline silicon can be formed with different predominant crystal orientations. These crystal orientations can be selected to match the desired TFT channel orientations for different areas of the device. The crystal orientations are selected by rotating a mask pattern to a different orientation for each desired crystal orientation. The mask is used in connection with lateral crystallization ELA processes to crystallize deposited amorphous silicon films.

4 Claims, 4 Drawing Sheets

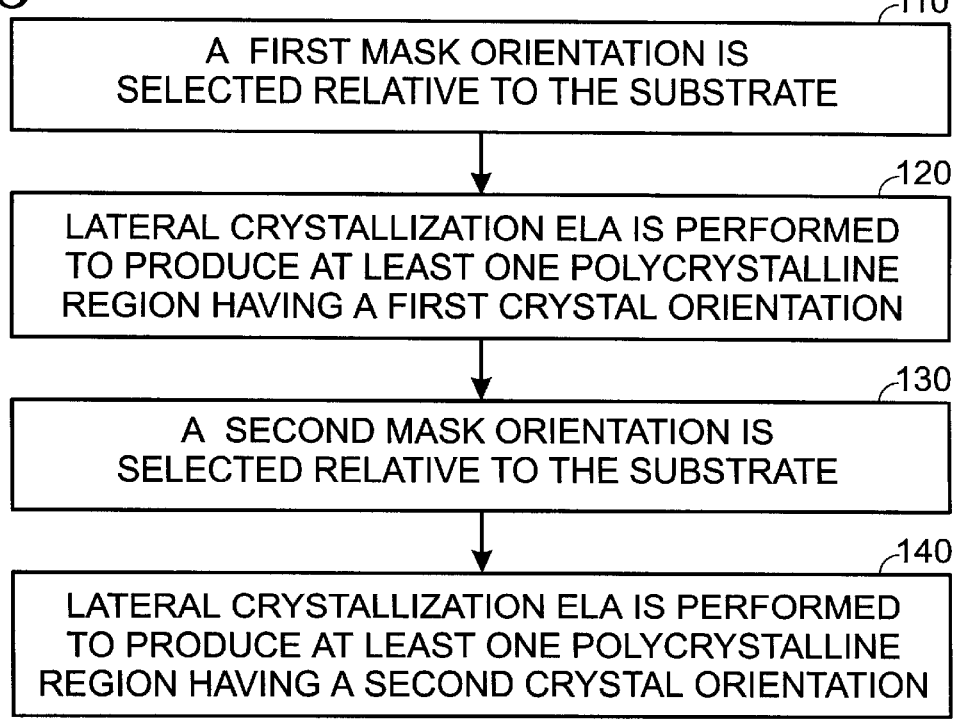
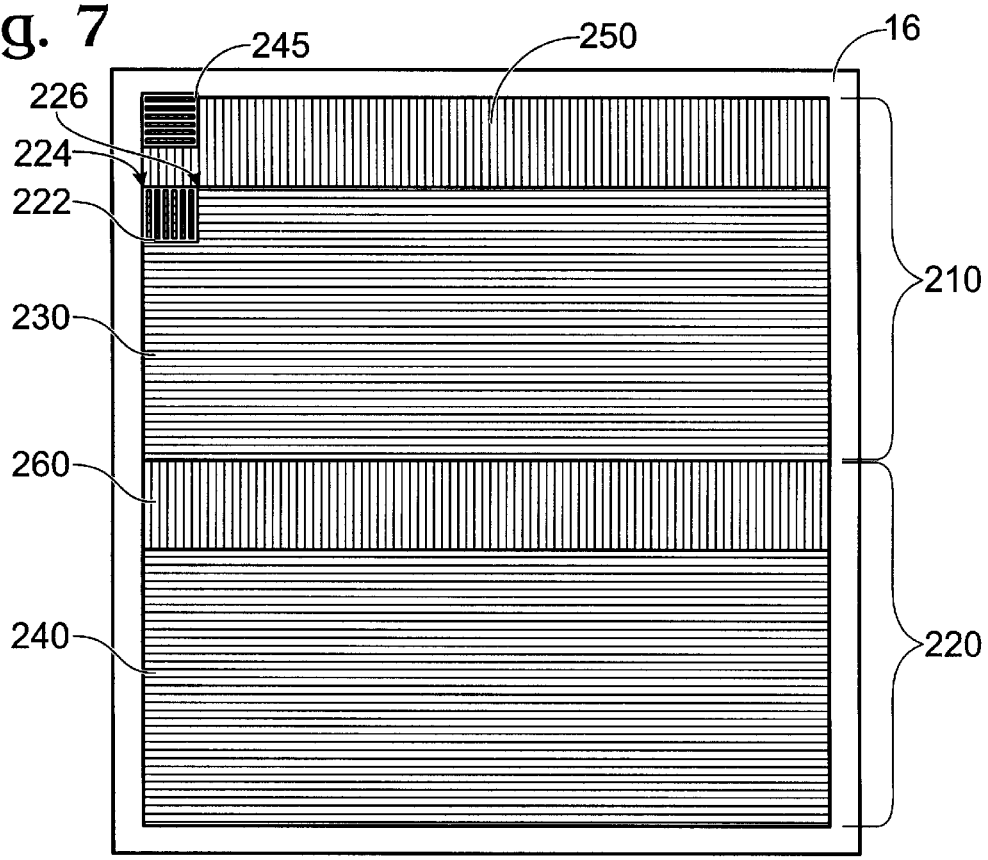

LCD DEVICE WITH OPTIMIZED CHANNEL CHARACTERISTICS

CROSS-REFERENCES

This application is a divisional of application Ser. No. 09/774,296, filed Jan. 29, 2001, entitled "Method of Optimizing Channel Characteristics Using Laterally-Crystallized ELA Poly-Si Films," invented by Apostolos Voutsas et al., now U.S. Pat. No. 6,495,405.

The subject matter of this application is related to the application entitled Method of Optimizing Channel Characteristics Using Multiple Masks To Form Laterally-Crystallized ELA Poly-Si Films by inventors Apostolos Voutsas, John W. Hartzell and Yukihiko Nakata filed on Jan. 29, 2001, application Ser. No. 09/774,290.

The subject matter of this application is also related to the application entitled Mask Pattern Design to Improve Quality Uniformity in Lateral Laser Crystallized Poly-Si films by inventor Apostolos Voutsas filed on Jan. 29, 2001, application Ser. No. 09/774,270.

All of these applications, which are not admitted to be prior art with respect to the present invention by their mention here, are incorporated herein by this reference.

BACKGROUND OF THE INVENTION

This invention relates generally to semiconductor technology and more particularly to a method of forming polycrystalline silicon within an amorphous silicon film.

Polycrystalline silicon thin film transistors (TFTs) can be used in a variety of microelectronics applications, especially active matrix liquid crystal displays (LCDs).

Thin film transistors (TFTs) used in liquid crystal displays (LCDs) or flat panel displays of the active matrix display type are fabricated on silicon films deposited on a transparent substrate. The most widely used substrate is glass. Amorphous silicon is readily deposited on glass. Amorphous silicon limits the quality of TFTs that can be formed. If driver circuits and other components are to be formed on the display panel, as well as switches associated with each pixel, crystalline silicon is preferred.

Silicon is often referred to as either amorphous or crystalline, including single crystal silicon. The term crystalline silicon can refer to either single crystal silicon, polycrystalline silicon, or in some cases materials with significant quantities of micro-crystal structures. For many application, single crystal material is most desirable. But, single crystal silicon is not readily producible. Amorphous silicon can be crystallized to form crystalline silicon by solid-phase crystallization. Solid-phase crystallization is carried out by high temperature annealing. But, glass substrates cannot withstand the temperatures necessary to melt and crystallize silicon. Quartz substrates can withstand high temperature annealing, but quartz substrates are too expensive for most LCD applications.

Because glass deforms when exposed to temperatures above 600° C., low-temperature crystallization (preferably below 550° C.) is used for solid-phase processing of silicon on glass. The low-temperature process requires long anneal times (at least several hours). Such processing is inefficient and yields polycrystalline silicon TFTs that have relatively low field effect mobility and poor transfer characteristics. Polycrystalline silicon produced by solid-phase crystallization of as-deposited amorphous silicon on glass suffers due to small crystal size and a high density of intragrain defects in the crystalline structure.

Excimer laser annealing (ELA) has been actively investigated as an alternative to low-temperature solid-phase crystallization of amorphous silicon on glass. In excimer laser annealing, a high-energy pulsed laser directs laser radiation at selected regions of the target film, exposing the silicon to very high temperatures for short durations. Typically, each laser pulse covers only a small area (several millimeters in diameter) and the substrate or laser is stepped through an exposure pattern of overlapping exposures, as is known in the art.

Lateral crystallization by excimer laser annealing (LC-ELA) is one method that has been used to form high quality polycrystalline films having large and uniform grains. LC-ELA also provides controlled grain boundary location.

According to one method of conducting LC-ELA, an initially amorphous silicon film is irradiated by a very narrow laser beamlet, typically 3–5 micrometers wide. Passing a laser beam through a mask that has slits forms the beamlet, which is projected onto the surface of the silicon film.

The beamlet crystallizes the amorphous silicon in its vicinity forming one or more crystals. The crystals grow within the area irradiated by the beamlet. The crystals grow primarily inward from edges of the irradiated area toward the center. The distance the crystal grows, which is also referred to as the lateral growth length, is a function of the amorphous silicon film thickness and the substrate temperature. Typical lateral growth lengths for 50 nm films is approximately 1.2 micrometers. After an initial beamlet has crystallized a portion of the amorphous silicon, a second beamlet is directed at the silicon film at a location less than half the lateral growth length from the previous beamlet. Moving either the laser, along with its associated optics, or by moving the silicon substrate, typically using a stepper, changes the location of the beamlet. Stepping a small amount at a time and irradiating the silicon film causes crystal grains to grow laterally from the crystal seeds of the poly-Si material formed in the previous step. This achieves lateral pulling of the crystals in a manner similar to zone-melting-crystallization (ZMR) methods or other similar processes.

As a result of this lateral growth, the crystals produced tend to attain high quality along the direction of the advancing beamlets, also referred to as the "pulling direction." However, the elongated crystal grains produced are separated by grain boundaries that run approximately parallel to the long grain axes, which are generally perpendicular to the length of the narrow beamlet.

When this poly-Si material is used to fabricate electronic devices, the total resistance to carrier transport is affected by the combination of barriers that a carrier has to cross as it travels under the influence of a given potential. Due to the additional number of grain boundaries that are crossed when the carrier travels in a direction perpendicular to the long grain axes of the poly-Si material, the carrier will experience higher resistance as compared to the carrier traveling parallel to the long grain axes. Therefore, the performance of TFTs fabricated on poly-Si films formed using LC-ELA will depend upon the orientation of the TFT channel relative to the long grain axes, which corresponds to the main growth direction. Typically, TFT performance varies by a factor of between 2 and 4 as a function of orientation relative to the main growth direction This difference in performance is undesirable from the point of view that as LCD resolution increases, or as panel size decreases, size limitations make it more desirable to have column drivers and row drivers oriented at ninety degrees relative to each other. Potentially resulting in one set of drivers having significantly different characteristics relative to the other.

SUMMARY OF THE INVENTION

Accordingly, a method of forming polycrystalline regions on a substrate is provided. A first mask orientation is selected. A laser beam is directed through the mask to irradiate the substrate over an initial region on the substrate. The region is annealed using a lateral crystallization process. A second mask orientation is selected. The laser beam is directed through the mask to irradiate the substrate over a second region on the substrate. The region is annealed using a lateral crystallization process. If the first and second mask orientations are different, the first region will have a different crystal orientation than the second region following annealing. The mask orientation is selected by rotating the mask or the substrate.

The method of the present invention is well suited for processing LCD devices. An LCD substrate, which can be composed of quartz, glass, plastic or other suitable transparent material, is used. An amorphous semiconductor material is deposited on the LCD substrate to form a thin layer of amorphous silicon. Preferably the semiconductor material will be silicon. A first region of the amorphous silicon is annealed using a first mask orientation in connection with a lateral crystallization ELA process to form a first polycrystalline region having elongated grain structures with a first crystal orientation. A second region of the amorphous silicon is annealed using a second mask orientation in connection with a lateral crystallization ELA process to form a second polycrystalline region having elongated grain structures with a second crystal orientation. The second crystal orientation is different from the first crystal orientation, and preferably the crystal orientations are substantially perpendicular with respect to each other.

For certain applications it is desirable to form thin film transistors (TFTs) using the polycrystalline material formed by laser annealing. In a preferred embodiment of the present method, TFTs having a first channel orientation are formed over the region with the first crystal orientation. The channel orientation is preferably substantially parallel to the crystal orientation, whereby the fewest number of crystal grain boundaries are crossed by the channel. TFTs having a second channel orientation formed over the region with the second crystal orientation.

BRIEF DESCRIPTION OF THE DRAWINGS

FIG. 6 is a flowchart diagram of an embodiment of the present invention.

FIG. 7 illustrates the formation of a substrate with multiple regions of different crystal orientation.

DETAILED DESCRIPTION OF THE INVENTION

Figure 1:
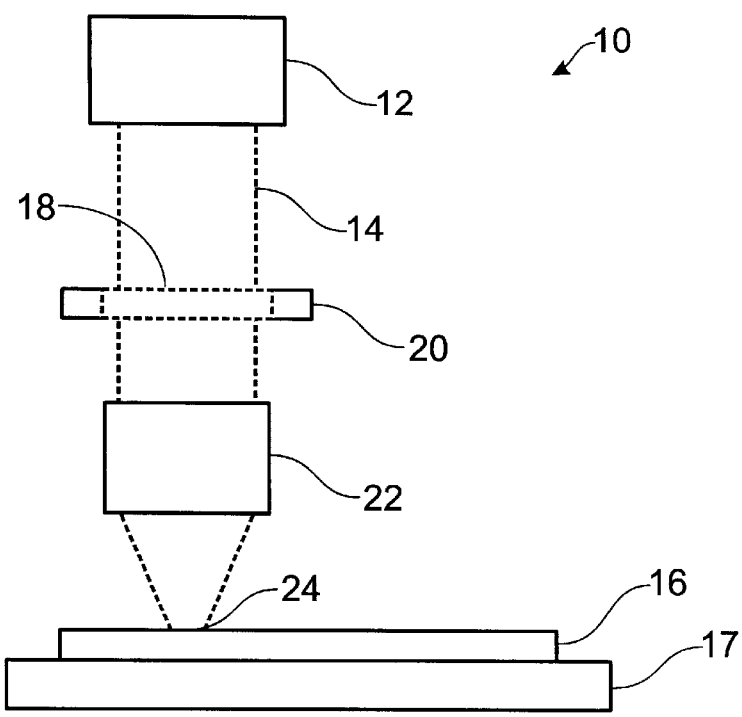
FIG. 1 is a schematic cross-sectional view showing an ELA apparatus used in connection with the present method.

Referring to FIG. 1 a lateral crystallization excimer laser annealing (LC-ELA) apparatus 10 is shown. LC-ELA apparatus 10 has a laser source 12. Laser source 12 may include a laser (not shown) along with optics, including mirrors and lens, which shape a laser beam 14 (shown by dotted lines) and direct it toward a substrate 16, which is supported by a stage 17. The laser beam 14 passes through a mask 18 supported by a mask holder 20. The laser beam 14 preferably has an output energy in the range of 0.8 to 1 Joule when the mask 18 is 50 mm×50 mm. Currently available commercial lasers such as Lambda Steel 1000 can achieve this output. As the power of available lasers increases, the energy of the laser beam 14 will be able to be higher, and the mask size will be able to increase as well. After passing through the mask 18, the laser beam 14 passes through demagnification optics 22 (shown schematically). The demagnification optics 22 reduce the size of the laser beam reducing the size of any image produced after passing through the mask 18, and simultaneously increasing the intensity of the optical energy striking the substrate 16 at a desired location 24. The demagnification is typically on the order of between 3× and 7× reduction, preferably a 5× reduction, in image size. For a 5× reduction the image of the mask 18 striking the surface at the location 24 has 25 times less total area than the mask, correspondingly increasing the energy density of the laser beam 14 at the location 24.

The stage 17 is preferably a precision x-y stage that can accurately position the substrate 16 under the beam 14. The stage 17 is preferably capable of motion along the z-axis, enabling it to move up and down to assist in focusing or defocusing the image of the mask 18 produced by the laser beam 14 at the location 24. In another embodiment of the method of the present invention, it is preferable for the stage 17 to also be able to rotate.

The mask holder 20 is preferably able to rotate between at least two desired positions. The mask holder 20 is also capable of x-y movement. In some embodiments both the mask holder 20 and the stage 17 are capable of rotating.

Figure 2:
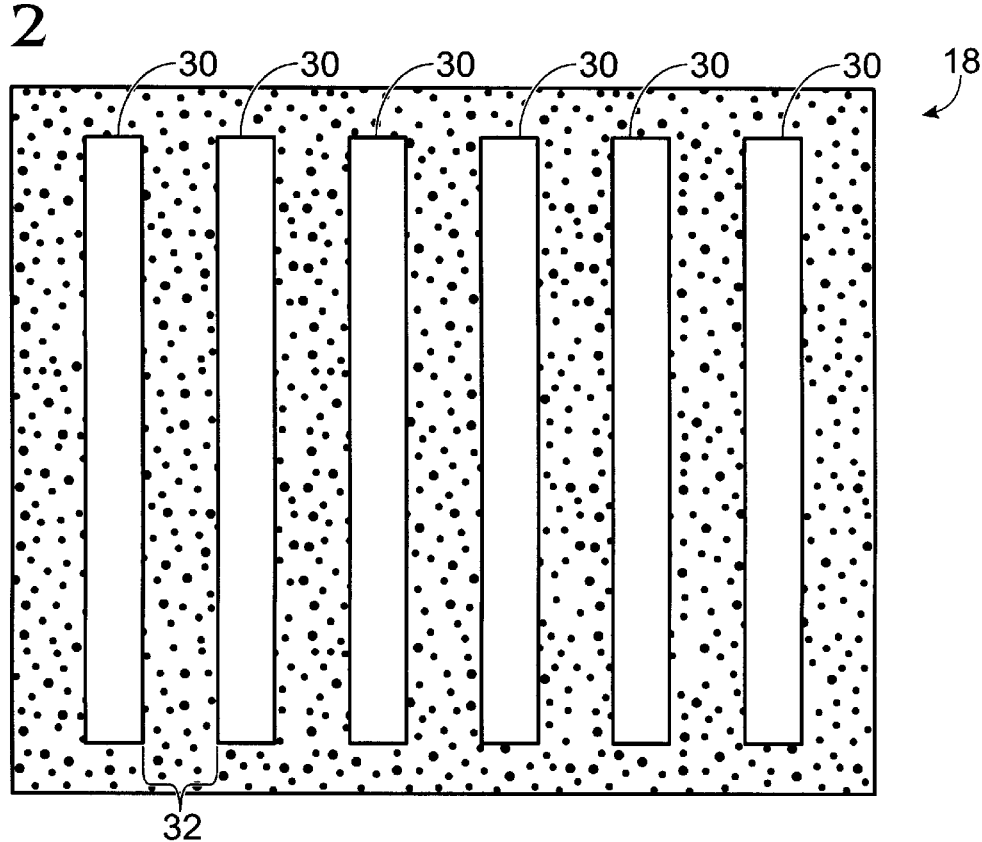
FIG. 2 shows a mask pattern.

FIG. 2 shows the mask 18 having a plurality of slits 30 with a slit spacing 32. The mask 18 is shown as a square, but it is also possible for the mask to be rectangular.

Figure 3:
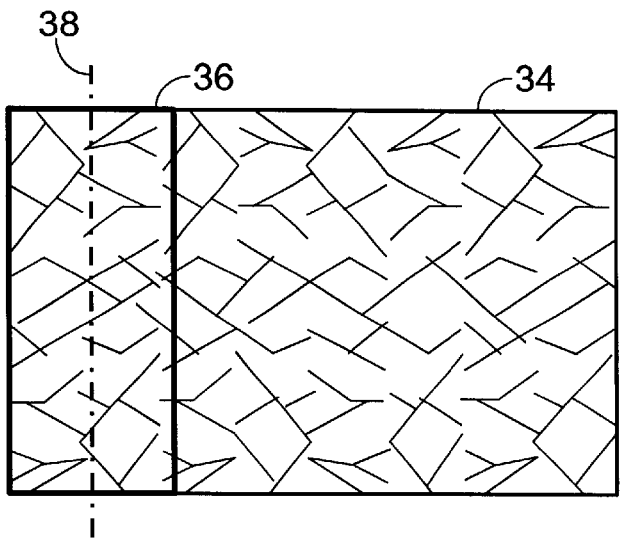
FIG. 3 illustrates a step in the process of lateral crystallization using ELA.
Figure 4:
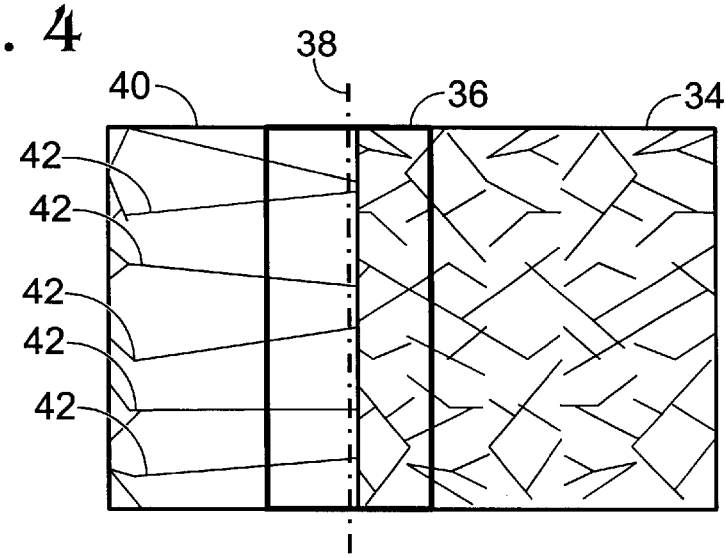
FIG. 4 illustrates a step in the process of lateral crystallization using ELA.
Figure 5:
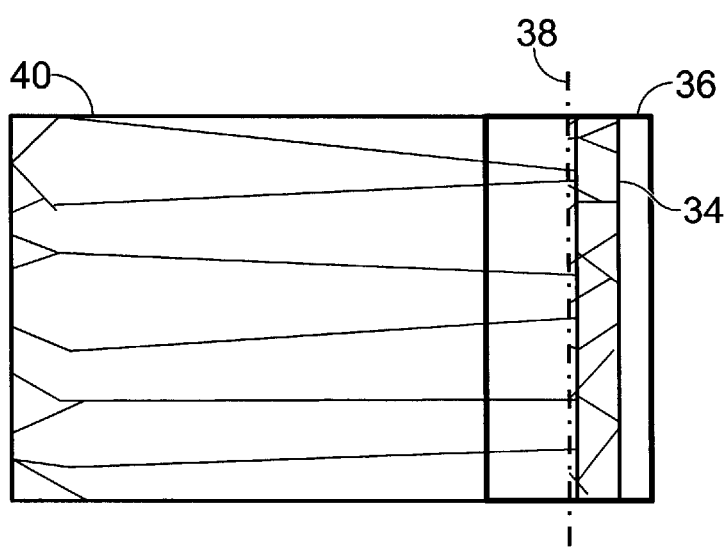
FIG. 5 illustrates a step in the process of lateral crystallization using ELA.

FIGS. 3 through 5 show the sequence of lateral crystallization employed as a portion of the present method. A region 34 of amorphous or polycrystalline silicon overlies the substrate. The rectangular area 36 corresponds to an image of one of the slits 30 projected onto the substrate. The dashed line 38 corresponds to the centerline of the image of the opening on the substrate.

FIG. 3 shows the region 34 just prior to crystallization. A laser pulse is directed at the rectangular area 36 causing the amorphous silicon to crystallize. After each pulse the image of the opening is advanced by an amount not greater than half the lateral crystal growth distance. A subsequent pulse is then directed at the new area. By advancing the image of the slits 30 a small distance, the crystals produced by preceding steps act as seed crystals for subsequent crystallization of adjacent material. By repeating the process of advancing the image of the slits and firing short pulses the crystal is effectively pulled in the direction of the slits movement.

FIG. 4 shows the region 34 after several pulses. As is clearly shown, the area 40 that has already been treated has formed elongated crystals that have grown in a direction substantially perpendicular to the length of the slit. Substantially perpendicular means that a majority of lines formed by crystal boundaries 42 could be extended to intersect with dashed line 38.

FIG. 5 shows the region 34 after several additional pulses following FIG. 4. The crystals have continued to grow in the direction of the slits' movement to form a polycrystalline region. The slits will preferably continue to advance a distance substantially equal to a distance on the substrate corresponding to the slit spacing 32. Each slit will preferably advance until it reaches the edge of a polycrystalline region formed by the slit immediately preceding it.

Referring now to FIG. 6, a flow chart of the steps of the method of the present invention is shown. Step 110 selects a first mask orientation. For consistency of description, the orientation is described relative to the substrate surface.

Step 120 performs lateral crystallization using excimer laser annealing (ELA) to produce a polycrystalline region having a first crystal orientation. A laser beam is used to project an image of the mask onto the substrate. The laser beam energy is sufficient to cause amorphous silicon to crystallize. As discussed above a sequence of laser pulses can be used to crystallize a region with a first crystal orientation.

Step 130 selects a second mask orientation. This second mask orientation is preferably substantially perpendicular to the first mask orientation.

Step 140 performs lateral crystallization ELA to produce a polycrystalline region having a second crystal orientation. The second crystal orientation is preferably substantially perpendicular to the first crystal orientation.

The steps of selecting a mask orientation (steps 110 and 130) can be accomplished by rotating the mask itself while leaving the substrate fixed. Alternatively, the substrate can be reoriented while leaving the mask fixed. Rotating the substrate may be harder to implement, but may be preferred if a rectangular beam profile is used due to the loss of point symmetry. A rectangular beam profile is sometimes used to make more effective use of the total laser power.

It is possible, and within the scope of the method of the present invention, to rotate both the mask and the substrate to achieve the desired mask orientation relative to the substrate.

In performance of the method, if multiple regions of the same orientation are desired, it is preferable to produce all of the regions with the first crystal orientation prior to reorienting the mask and producing regions of the second crystal orientation. Multiple regions with the same orientation are preferred when producing multiple devices on a single substrate.

FIG. 7 shows the substrate 16 with two display regions 210 and 220. Each display region corresponds to the location of a final LCD or other display device. The first mask orientation is selected. Then the image 222 of the mask is projected at a first starting position 224.

In an embodiment of the present method, the image 222 is moved one step at a time by moving the mask stage. At each step a laser pulse crystallizes a portion of the silicon material. Once the image 222 has moved a distance corresponding to the slit spacing, the substrate is moved to position the image 222 over an adjacent position 226. The mask is then moved to crystallize the underlying region. By repeating this process across the substrate, a line of polycrystalline material having predominantly a first crystal orientation is formed. The image 222 is repositioned at a position corresponding the start of the adjacent un-crystallized region. The process is repeated until a region 230 is formed having predominantly a first crystal orientation. As shown this orientation is horizontal. After a first region 230 is formed, repeating the process discussed above can produce a second region 240 having the same general crystal orientation as the first region 230.

In a preferred embodiment, once regions of a first crystal orientation have been produced, the mask is reoriented relative to the substrate 16. The process is then repeated to produce regions with a second crystal orientation. Preferably, the second crystal orientation will be substantially perpendicular to the first crystal orientation. A third region 250 is formed by positioning the rotated image 245 over another starting point and processing the region as discussed above until the region 250 has been crystallized. A fourth region 260 could then be crystallized to have the same orientation as the third region 250.

In this manner, multiple regions can be crystallized with two or more crystal orientations. The order of crystallization is not critical to the present invention.

Figure 8:
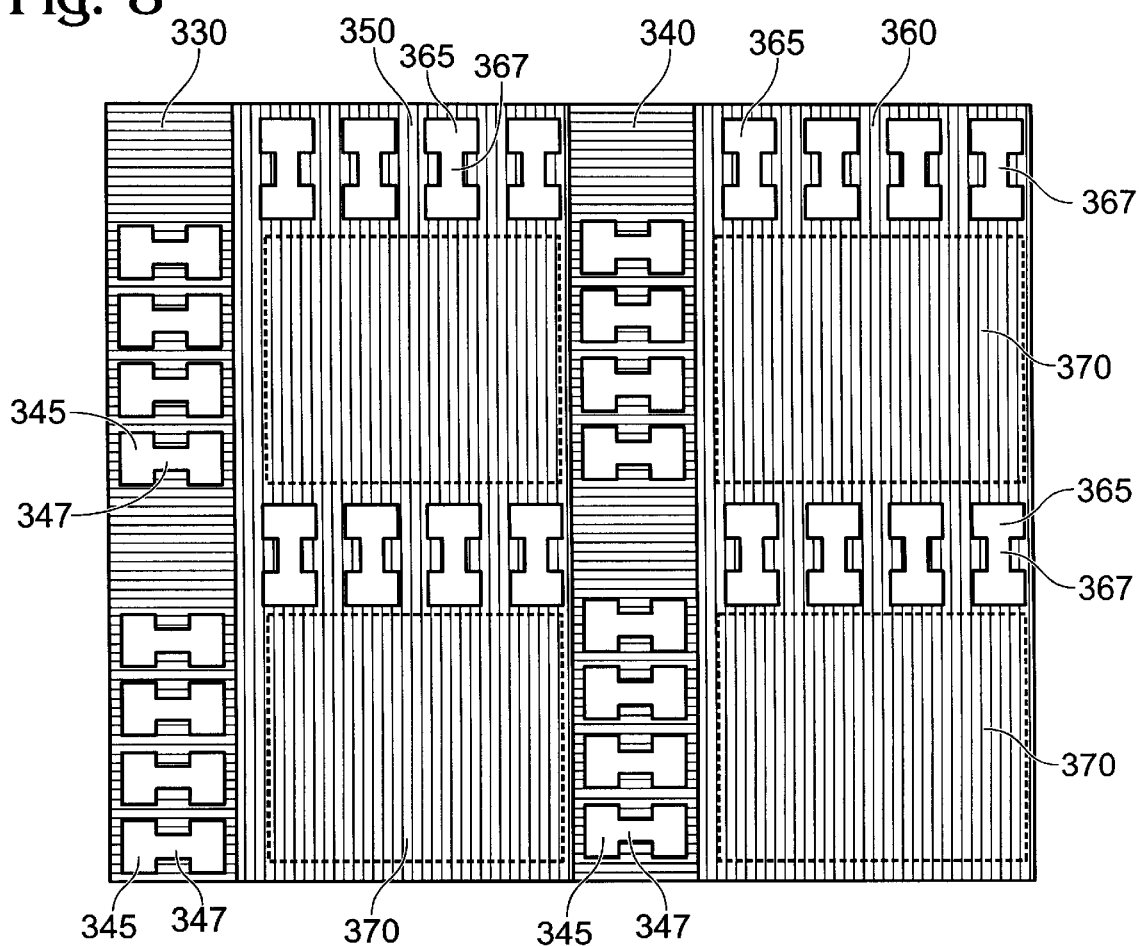
FIG. 8 illustrates the formation of TFTs with channels aligned to the crystal orientation to optimize performance.

Once the substrate 16 has been processed to form regions with the desired crystal orientation, device elements are formed on the substrate as illustrated in FIG. 8. FIG. 8 is for illustration purposes, and as with the other drawings, is not drawn to scale. The substrate 16 has a first polycrystalline region 330 and a second polycrystalline region 340 with the same crystal orientation. A first set of TFTs 345 have been formed within polycrystalline regions 330 and 340. First set of TFTs 345 have channels 347 oriented to match the crystal orientation of the underlying regions 330 and 340. As shown in the figure, both the crystal orientation of regions 330 and 340, and the channels 347 are horizontal. Third polycrystalline region 350 and fourth polycrystalline region 360 are shown having a crystal orientation substantially perpendicular to the crystal orientation of regions 330 and 340. A second set of TFTs 365 having channels 367 are substantially perpendicular to the first set of TFTs 345 and channels 347, and substantially parallel to the crystal orientation of the underlying regions 350 and 360.

Since FIG. 8 illustrates a display device, pixel regions 370 are shown. The pixel regions 370 can have the same underlying crystal orientation as either the regions under the first set of TFTs 345, also referred to as row drivers, or the second set of TFTs 360, also referred to as the column drivers. As shown in FIG. 8, the pixel region is matched to the column drivers. If the substrate shown in FIG. 7 were used, the pixel region would match the row drivers. For some applications, it may not be necessary to crystallize the entire substrate. Some regions may not need to be crystallized including, but not limited to the pixel regions.

Although the present method is well suited to producing display devices, it is also suited to other types of device produced using a polycrystalline material produced on an underlying substrate. In addition to row and column drivers, other circuitry unrelated to displays can be produced.

The terms perpendicular and parallel should not be construed narrowly to limit the scope of the present method, especially in reference to crystal orientation. The terms substantially perpendicular and substantially parallel should be construed broadly. A broader definition of these term parallel is therefore provided. If a feature, or structure, is said to be parallel to the crystal orientation, the structure crosses the fewest crystal grain boundaries in the relevant direction.

Several embodiments of the method of the present invention have been described. Variations on these embodiments will be readily ascertainable by one of ordinary skill in the art. Therefore, the description here is for illustration purposes only and should not be used to narrow the scope of the invention, which is defined by the claims as interpreted by the rules of patent claim construction.

What is claimed is:

1. A liquid crystal display (LCD) device comprising:
   a) a transparent substrate;
   b) a layer of semiconductor material having polycrystalline regions overlying the transparent substrate, wherein at least two crystal regions having different predominant crystal orientations are present;
   c) a first set of thin film transistors having channels oriented substantially parallel to the predominant crystal orientation of a first polycrystalline region; and
   d) a second set of thin film transistors having channels oriented substantially parallel to the predominant crystal orientation of a second polycrystalline region.

2. The LCD device of claim 1, wherein the transparent substrate is quartz, glass or plastic.

3. The LCD device of claim 1, wherein the semiconductor material is silicon.

4. The LCD device of claim 1, wherein the first polycrystalline region and the second polycrystalline region have predominant crystal orientations substantially perpendicular to each other.

* * * * *